United States Patent [19]
Schumacher et al.

[11] Patent Number: 5,502,621
[45] Date of Patent: Mar. 26, 1996

[54] MIRRORED PIN ASSIGNMENT FOR TWO SIDED MULTI-CHIP LAYOUT

[75] Inventors: Daniel L. Schumacher, Tewksbury, Mass.; John Wood, Rochester, N.H.

[73] Assignee: Hewlett-Packard Company, Palo Alto, Calif.

[21] Appl. No.: 221,144

[22] Filed: Mar. 31, 1994

[51] Int. Cl.$^6$ .................................................. H05K 7/02
[52] U.S. Cl. ...................... 361/760; 361/772; 361/803; 361/813; 257/692
[58] Field of Search ........................ 361/760, 772, 361/813, 803; 257/724, 692, 734; 439/68; 427/70, 213

[56] References Cited

U.S. PATENT DOCUMENTS

| | | |
|---|---|---|
| 4,724,531 | 2/1988 | Angleton et al. . |
| 4,994,896 | 2/1991 | Uemura et al. . |
| 5,270,964 | 12/1993 | Bechtolsheim et al. . |

FOREIGN PATENT DOCUMENTS

| | | |
|---|---|---|
| 0484062A1 | 10/1991 | European Pat. Off. . |
| 59-144155 | 8/1984 | Japan ............................ 257/724 |
| 1-305562 | 12/1989 | Japan ............................ 257/724 |
| 2166899 | 5/1986 | United Kingdom . |

OTHER PUBLICATIONS

I "Intel Integrated Circuit Handbook," 1992.

*Primary Examiner*—Leo P. Picard
*Assistant Examiner*—Y. Whang
*Attorney, Agent, or Firm*—Richard F. Schuette

[57] ABSTRACT

The invention provides for increased IC density on circuit boards having at least one IC mounted on each side of a two sided PC or SMT board by utilizing one or more IC's having pin assignments arranged as a mirror image of each other along a centerline through the IC package in the X or Y axis, such that one or more IC's having the same set of mirror image pin assignments mounted on each side of a circuit board and rotated 180 degrees in relationship to each other will ensure that the pin assignments of the same type will be directly opposite each other and separated by the circuit board.

13 Claims, 8 Drawing Sheets

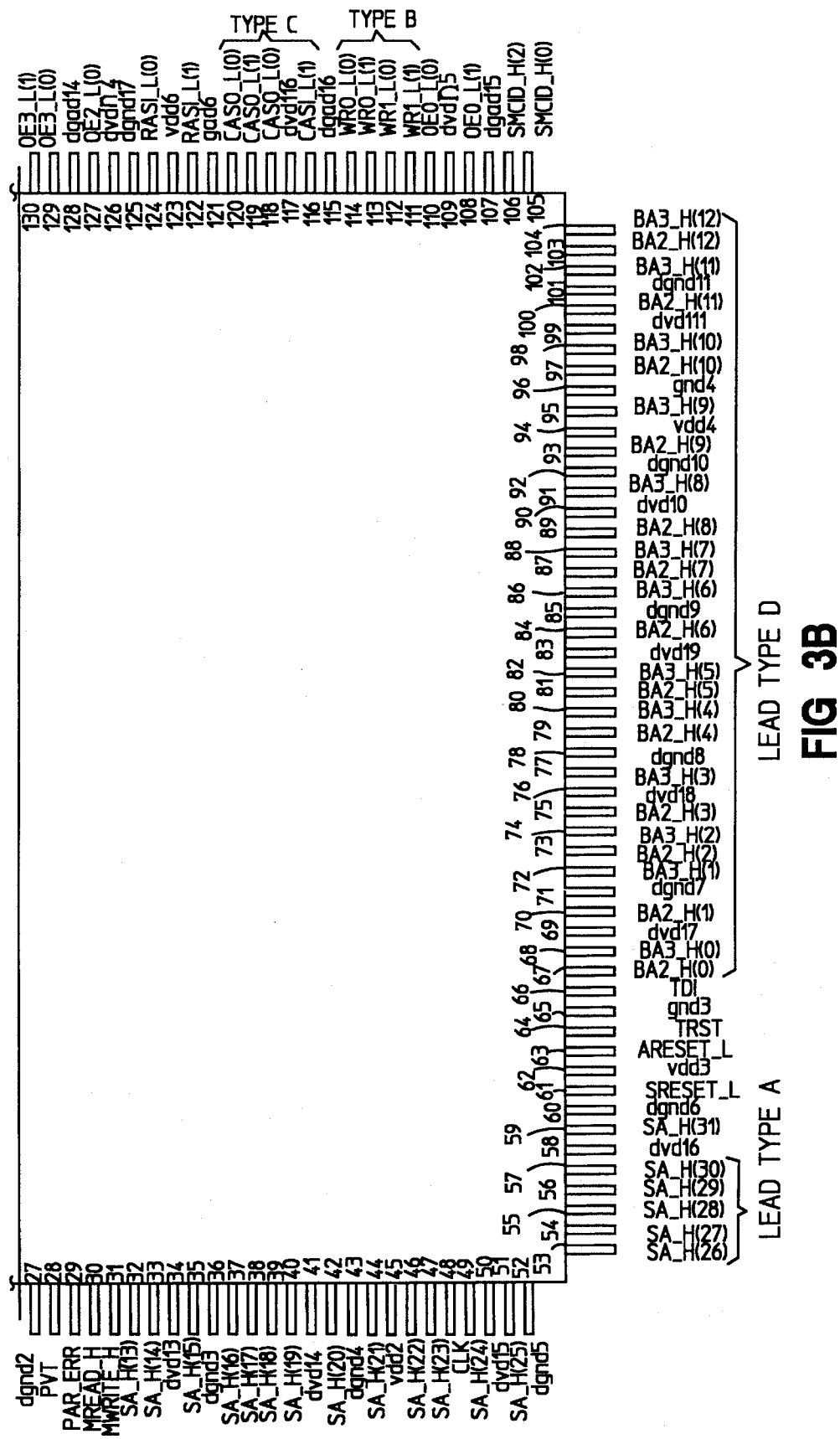

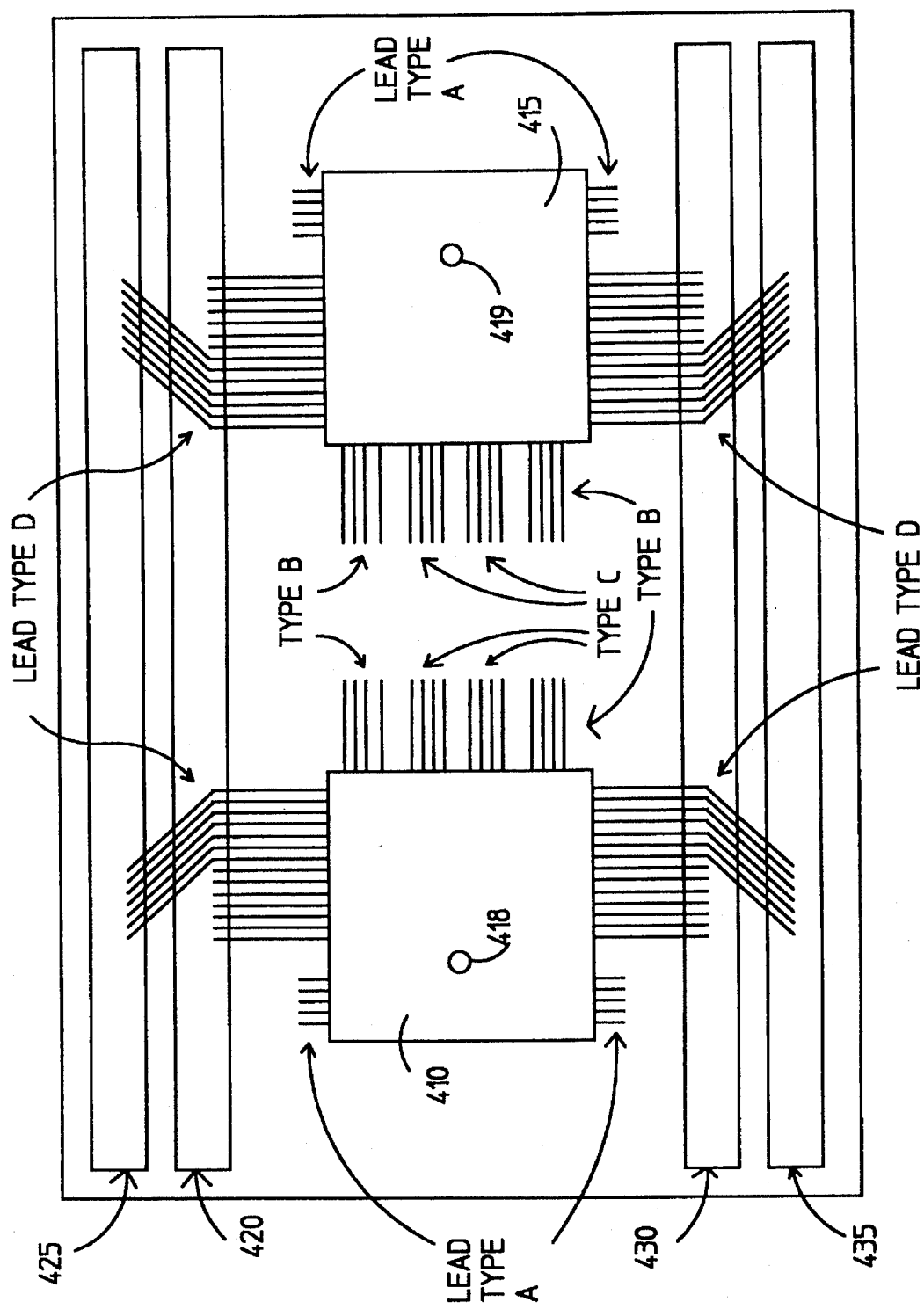

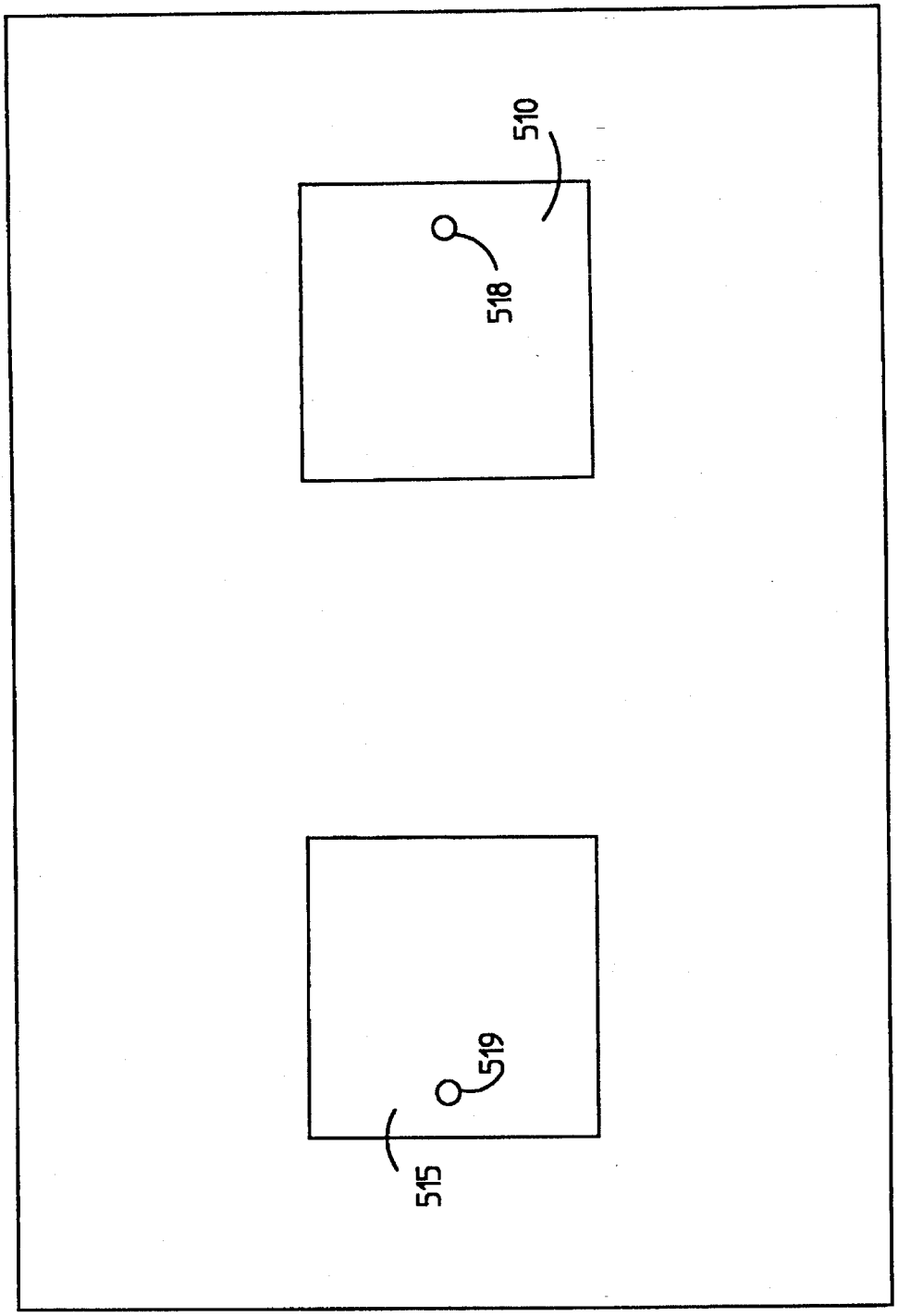

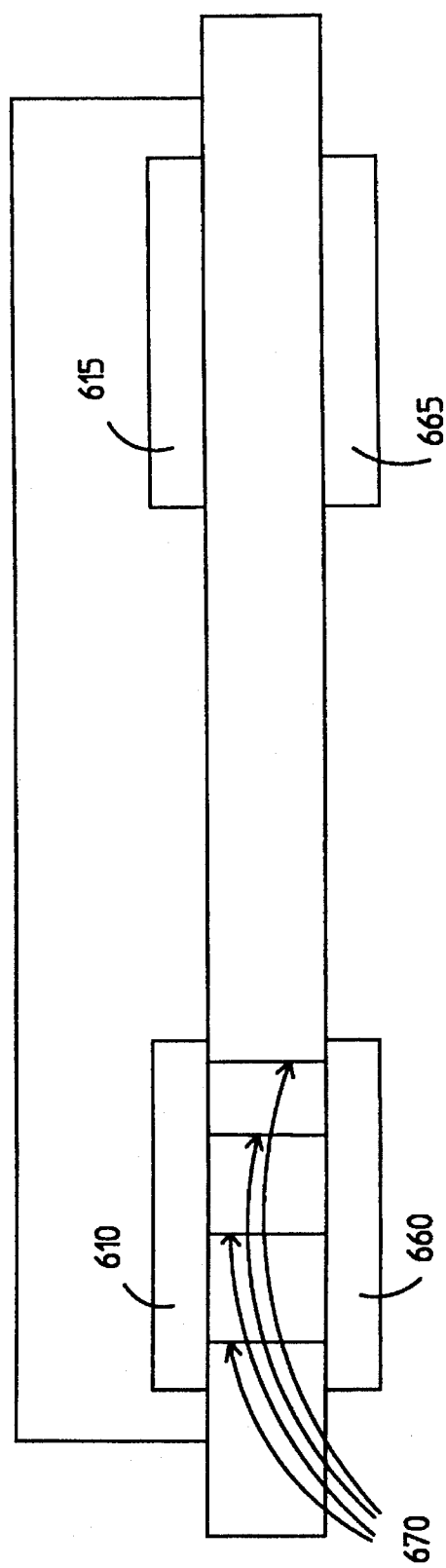

MIRRORED PIN ASSIGNMENT FOR TWO SIDED MULTI-CHIP LAYOUT

FIELD OF THE INVENTION

The present invention relates to integrated circuit design and more particularly, improved lead routing through an integrated circuit packaging design having a mirrored pin assignment.

BACKGROUND OF THE INVENTION

Lead routing between Integrated Circuits (IC's) on a Printed Circuit (PC) board plays an important role in both the cost and the performance of the PC board design. The cost of manufacturing a PC board is directly related to the number of layers required to effectively route all of the leads between the IC's. The ability to reduce the number of leads, match the length of leads and the potential for interference between leads enhances the performance of the PC board. As the IC density on PC boards increase and the number of pin assignments and associated leads per IC go up, lead routing becomes increasingly more difficult.

In the mid-80's, surface mount technology (SMT) and double sided SMT were introduced as an alternative to standard through-hole PC board technology. Instead of pre-drilling PC boards to accept the pins of IC's, special packaging for IC's was developed which provided for gluing IC's to the PC board. Since the requirement for sticking pins through to the opposite side of the PC board and soldering the IC's in place was eliminated, it became possible to mount IC's on both sides of the PC board.

Even though SMT provides for increased efficiency in lead routing, problems still exist as the total number of IC's on the PC board doubles with two-sided SMT. The number of leads required to interconnect IC's goes up with both the total number of IC's on the PC board, as well as with advances in Very Large Scale Integration (VLSI) design (up to 1,000,000 components may now be integrated into a single IC). A standard 1 megabyte memory chip has 44 pin assignments, a custom memory controller chip may have over 200 pin assignments, and a multichip module (MCM) which approaches 2.5 centimeters square may have over 500 pin assignments.

The layout of a circuit board generally proceeds from the circuit diagram to a geometric layout in which IC's are grouped in their respective isolation regions. Leads coupling IC's are laid out to eliminate potential lead crossovers. Lead routing is a three dimensional problem and becomes very complex with high chip and associated lead densities. Lead crossovers are typically eliminated by adding additional layers to the circuit board such that leads can be re-routed through vias to different levels. Via is the term used to describe a hole partially through the circuit board which enables a lead to travel from one board level to another. Additionally, lead routing is made even more complex as constraints such as maximum length and a consistency between lead lengths must be provided for.

As circuit speeds increase the distributed capacitance and inductance over the length of each lead causes it to act like transmission lines. Reduction of the overall lead length reduces adverse electronic emissions from the circuit board. Crosstalk (an undesirable coupling between an active line and an adjacent passive line) may occur do to mutual inductance or capacitance. Crosstalk can also cause a loss of signal strength in the active line, and interference or false triggering in an adjacent line. Lateral crosstalk may occur when adjacent leads are located on the same plane. Leads located on opposite sides of a dielectric laminate may result in vertical crosstalk. Crosstalk can be minimized by increasing the distance between adjacent leads or reducing the length of parallel lead sections. Vertical crosstalk can be virtually eliminated by orthogonal routing of leads on adjacent layers.

In circuit boards incorporating more than one IC of the same type, circuit board complexity, problems associated with crossover and crosstalk, can be minimized by utilizing pairs of integrated circuits designed with two identical but reversed pin assignments. As illustrated in FIG. 1, an eight MBIT Flash memory sold by Intel (F28F008SA) is offered in both a standard pin assignment (FIG. 1A) and a reversed pin assignment (FIG. 1B) configuration. By alternating the memory chips in a serpentine layout (FIG. 2), the reversed pin assignment provides for a greatly simplified board layout as crossovers and the length of the interconnecting leads are minimized. Unfortunately, two different IC's must be manufactured and proper placement on the PC board necessitates subsequent identification during IC insertion.

Another example of the prior art is disclosed in U.S. Pat. No. 5,270,964 issued Dec. 14, 1993 to Bechtolsheim et al. Bechtolsheim discloses a single in-line memory module (SIMM) having two hundred pin assignments. A high number density connector is used to connect the SIMM to a memory module socket on a PC board. All power and ground leads are symmetrically arranged within the connector. Power and ground leads alternate every sixteen pins such that if the SIMM is inadvertently inserted in a reversed position into the memory module socket, the symmetrical power and ground leads prevent the SIMM from being reverse-powered, and likely destroyed.

There is accordingly a need to provide for simplified lead routing and the reduction of the number of layers in the PC board required to accommodate the demands of high density IC's and multichip modules having hundreds of pin assignments.

SUMMARY OF THE INVENTION

The invention provides for increased IC density on circuit boards having at least one IC mounted on each side of a two sided PC or SMT board. One or more of the IC's may be designed such that pin assignments are arranged as a mirror image of each other along a centerline through the IC package in the X or Y axis. Thus, providing for a mirror image IC package. One or more IC's having the same set of mirror image pin assignments are mounted on each side of a circuit board. Rotating each new IC 180 degrees in relationship to an IC already positioned directly on the opposite side of the circuit board, will ensure that the pin assignments of the same type will be directly opposite each other and separated by the circuit board.

Lead routing is greatly simplified as leads emanating from pin assignments of the same type (on opposite sides of the circuit board) can now be routed in the same direction and are less likely to have crossover related problems. Lead lengths for similar types of leads between two IC's are more easily maintained within requisite length tolerances. Additionally, two IC's directly opposite each other on either side of the circuit board have identical pin assignments (such as ground and power) and may be coupled together through the circuit board for twice the current flow.

While it is generally not possible to ensure that all pin assignments have a mirror image counterpart, the invention proves advantageous even when only a small plurality of pin assignments have a mirror image counterpart. As the number of IC's having mirror image pin assignments increase, the advantages of the invention are magnified. In the preferred embodiment, a substantial number of the pin assignments have a mirror image counterpart.

Finally, where an IC is not operated at the same time as the IC positioned opposite it, only one set of leads will be transmitting information and as a result crosstalk between leads on opposite sides of the circuit board is minimized.

BRIEF DESCRIPTION OF THE DRAWINGS

FIG. 3B is a right hand side plan view of a mirror image Ic designed in accordance with the preferred embodiment of the invention.

FIG. 4 is a plan view of the top of a circuit board layout constructed in accordance with the preferred embodiment of the invention.

FIG. 5 is a plan view of the bottom of a circuit board layout constructed in accordance with the preferred embodiment of the invention.

FIG. 6 is a cross-sectional view of the circuit board in accordance with the preferred embodiment of the invention.

DESCRIPTION OF THE PREFERRED EMBODIMENT

Figure 1A:
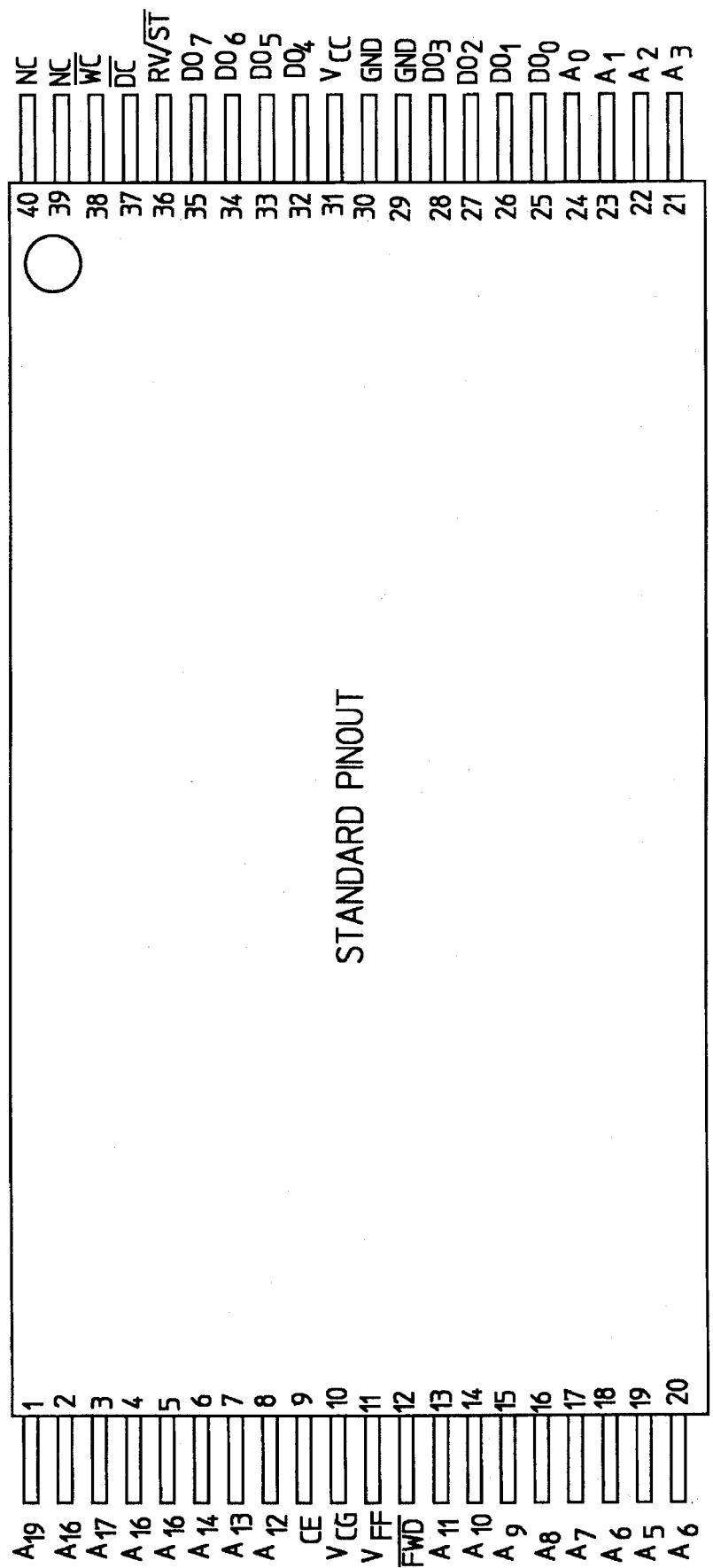
FIG. 1A is a plan view of a prior art IC having a standard pin assignment and FIG. 1B is a second prior art IC having a reversed pin assignment.
Figure 1B:
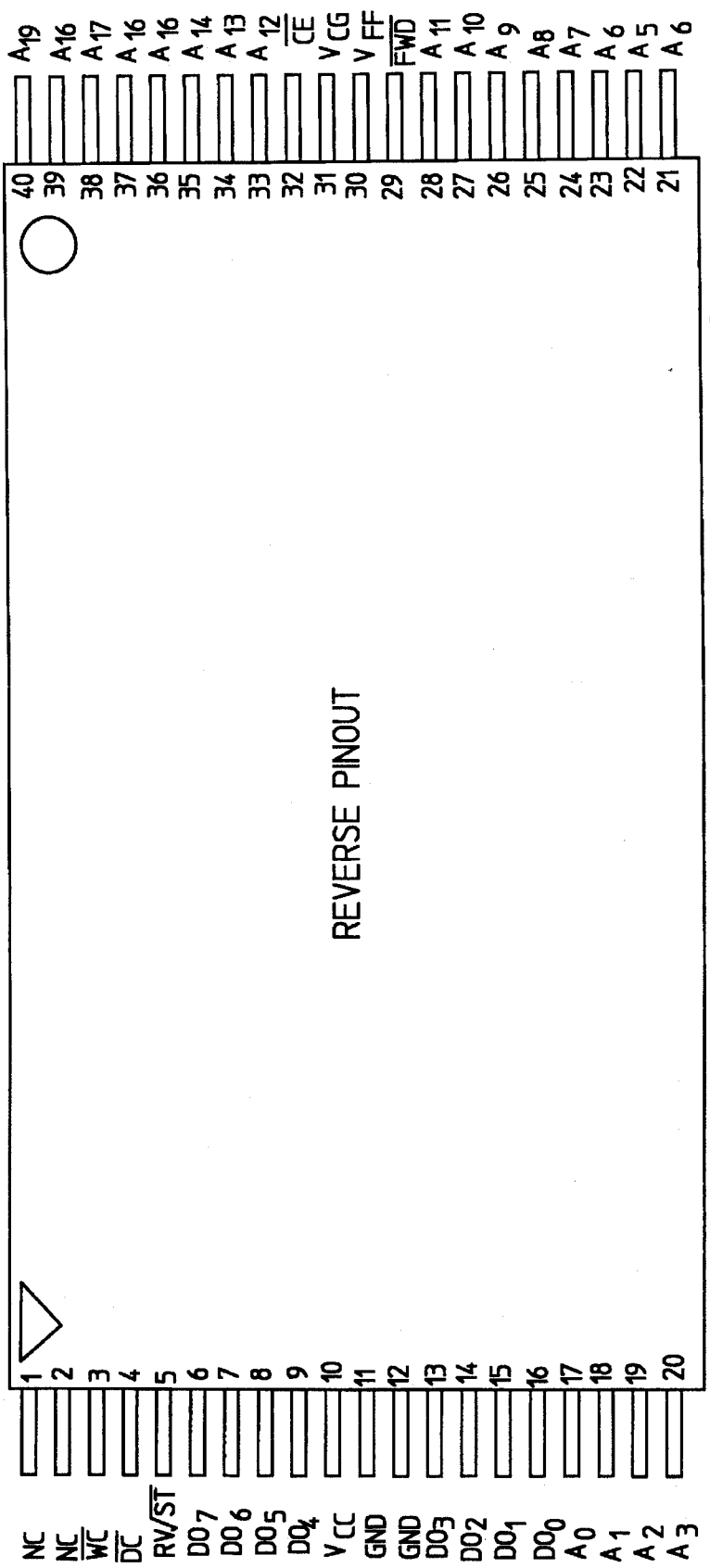
Figure 2:
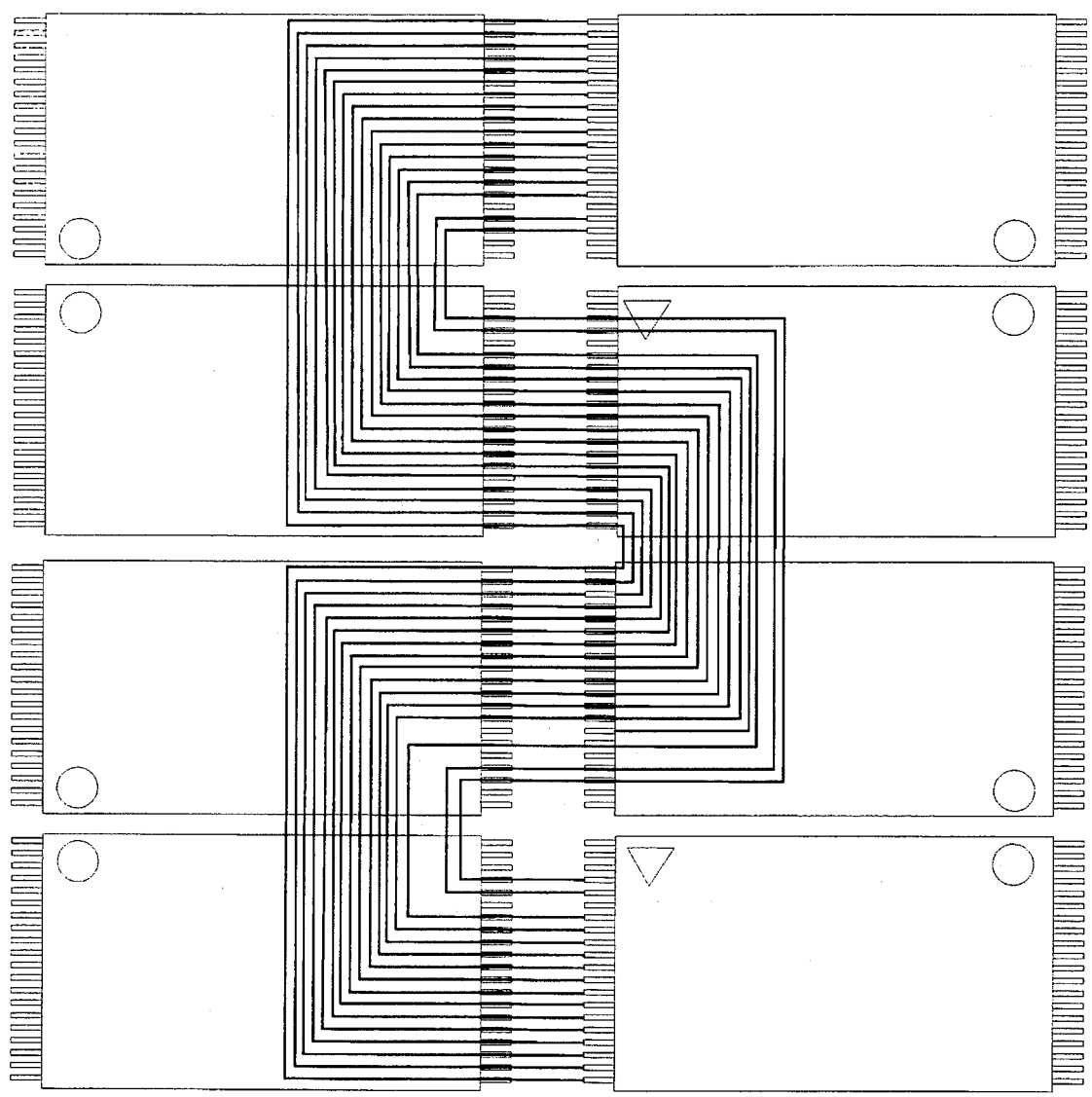
FIG. 2 is a plan view of a prior art PC board layout incorporating the prior art IC's of Fig.1 in a symmetrically blocked architecture.
Figure 3A:
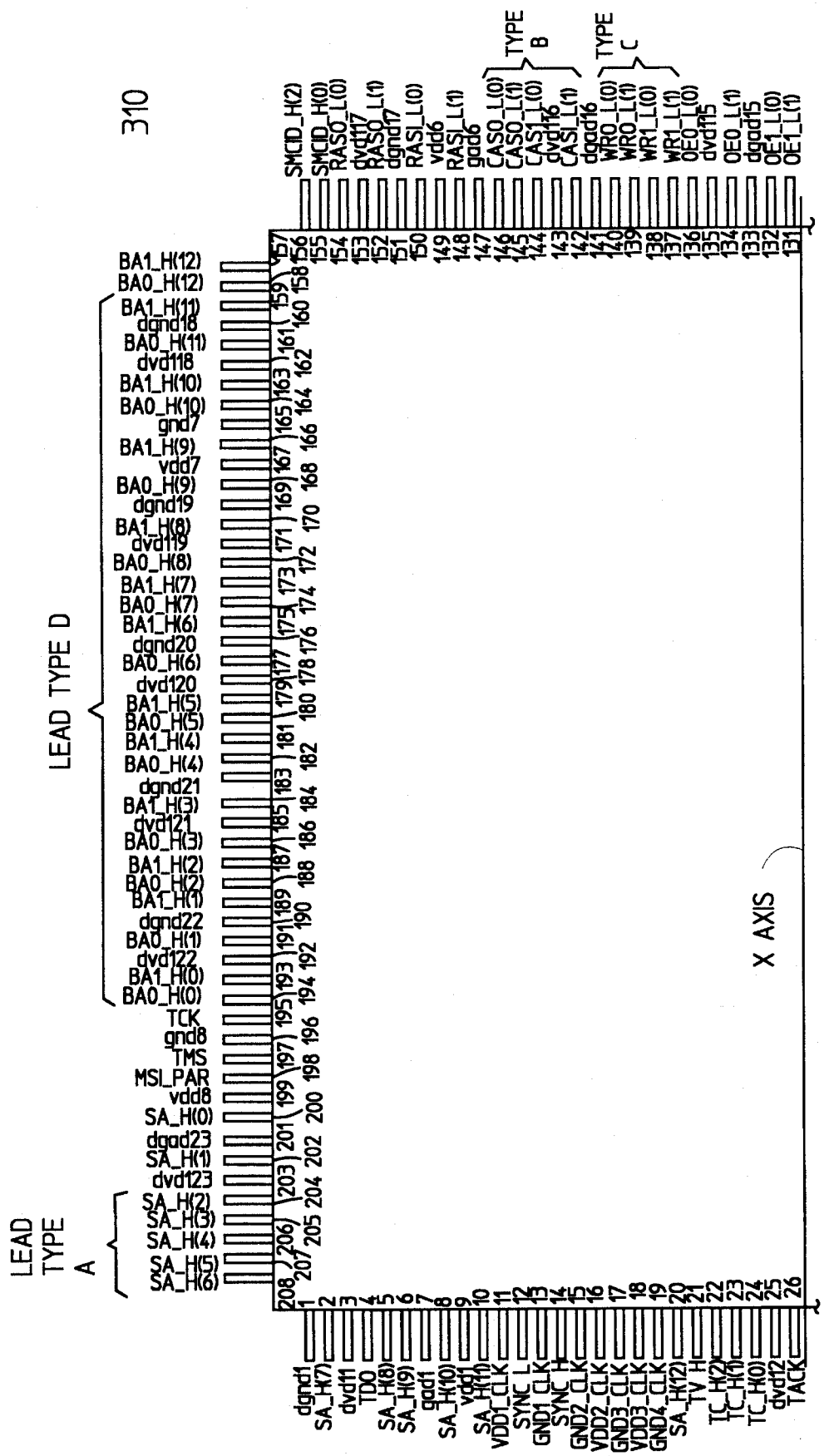
FIG. 3A is left hand side plan view of a mirror image IC designed in accordance with the preferred embodiment of the invention.

FIG. 3 illustrates an integrated circuit constructed according to the invention. Preferably, a slave memory controller IC chip 310 having a pin assignment mirrored in the X axis. In particular, ground lead 1 (dgnd1) is at pin assignment 1 located in the top left corner of the IC. Mirrored down to the bottom left corner is ground lead 5 (dgnd5) at pin assignment 52. Various ground, power, data, strobe, clock and address leads around the chip package have pin assignments which are positioned as a mirror image of each other. Where possible, these pin assignments are grouped together to further reduce the possibility of lead crossover. Most IC's have multiple numbers of pin assignments of the following types; address, data, column address strobe, row address strobe, error correction, write enable, reset and power. Mirror image counterparts are formed by locating, around the IC package, pin assignments of each type an equal distance from the centerline.

In the preferred embodiment, lead type A located across the top let corner and bottom left corner of the IC package defines a group of 6 SA_ pin assignments and a ground pin assignment, lead type B located halfway up the right upper and lower half of the IC package defines a group of four column address strobe (CAS) signals and a power pin assignment (dvd). Lead type C is also located on the right side but closer to the x axis centerline and defines for write (WR) pin assignments and lead type D is located across most of the top and bottom of the IC package and defines 26 address lines BA on each side.

FIG. 4 illustrates the top view of SMT board 400 having two identical memory controller chips 410 and 415 (manufactured in accordance with the invention) mounted between SIMM module bank 420 and SIMM module bank 430. All of which are mounted between SIMM module bank 425 and SIMM module bank 435. As denoted by circular marker 418 and circular marker 419, memory controller chip 415 is rotated 180 degrees in relationship to memory controller chip 410. Since the sets of type B and sets of type C pin assignments located equidistant from the X axis, similar types of leads are directed towards each other. A plurality of leads couple the pin assignments from the memory controller chips to the SIMM modules 425 and 435.

FIG. 5 is a view of the bottom side of the SMT board illustrated in FIG. 4. Memory controller chip 515 is mounted directly opposite memory controller chip 410 of FIG. 4, however, note that it is now located on the right side of the SMT board (whereas memory controller chip 410 is mounted on the left side) and as denoted by the circular marker 518, memory controller chip 510 is rotated 180 degrees from its top side counterpart such that their pin assignments and associated lead routings match. Memory controller chip 515 is now on the left side and as denoted by the circular marker 519, memory controller chip 515 is rotated 180 from its top side counterpart. Furthermore, leads not illustrated couple the pin assignments from the memory controller chips 510 and 515 to SIMM modules 420 and 430 on the opposite side of the PC board. The leads pass through vias to lower levels such that connections can be made to the SIMM modules mounted on the top side of the PC board. Lead routing is greatly simplified as leads emanating from pin assignments of the same type (on opposite sides of the circuit board) are routed in the same direction and are less likely to have crossover related problems. Lead lengths for similar types of leads between two IC's are easily maintained within requisite length tolerances as the routings are very similar. Additionally, where two pin assignments located directly opposite each other on either side of the circuit board are identical (such as ground (grd) and power (dvd) they may be coupled together through the circuit board for twice the current flow.

FIG. 6 illustrates how the memory controller chips 610 and 615 are mounted directly opposite memory controller chips 660 and 665. The inherent mirror image of the pin assignments of the memory controllers ensure that the back to back pin assignments will be very similar. Such similarity makes lead routing easier as leads which typically go in the same direction will not have to crossover each other. Additionally, identical leads such as ground and power may be coupled together through circuit board vias 670 for increased current flow.

We Claim:

1. An integrated circuit package for mounting to a circuit board having a top side and a bottom side, comprising:
   a plurality of pin assignments, arranged as a mirror image around the periphery of said package and positioned as a mirror image of each other along an arbitrary axis drawn through the center of said IC package;
   a plurality of non-mirror image pin assignments, wherein, said integrated circuit package provides for enhanced lead routing on said circuit board when mounting a first integrated circuit package on the top side and said second integrated circuit package is mounted on said bottom side, and wherein said integrated circuit packages are rotated 180 degrees with respect to each other such that said mirror pin assignments are directly opposite each other on opposite sides of said circuit board.

2. The integrated circuit package as claimed in claim 1, wherein said pin assignments are grouped together by type of mirror image pin assignments.

3. The integrated circuit as claimed in claim 1, wherein a plurality of said mirror image pin assignments are identical pin assignments.

4. The integrated circuit as claimed in claim 3, wherein said identical pin assignments further comprise ground pin assignments which are coupled together through said circuit board.

5. The integrated circuit as claimed in claim 3, wherein said identical pin assignments further comprise power pin assignments.

6. A circuit board having a top side and a bottom side, said circuit board comprising;
   a first mirror image integrated circuit mounted on said top side and a second mirror image integrated circuit mounted on said bottom side, said first and second mirror image integrated circuits being rotated 180 degrees with respect to each other and positioned directly opposite each other on either side of said circuit board, wherein, said first and second integrated circuits further comprising a package having a plurality of pin assignments arranged as a mirror image around the periphery of said package and positioned as a mirror image of each other along an arbitrary axis drawn through the center of said IC package and a plurality of non-mirror image pin assignments, wherein, said plurality of mirror image pin assignments will be directly opposite each other on either side of said circuit board.

7. The circuit board as claimed in claim 6, wherein, said pin assignments being further grouped into a plurality of different types of mirror image pin assignments.

8. The circuit board as claimed in claim 7, further comprising;
   a system bus having at least one type of pin assignments identical to said mirror image integrated circuit,
   a plurality of SIMM modules having a least one type of pin assignments identical to said mirror image integrated circuit, wherein said plurality of different types of mirror image pin assignments of said mirror image integrated circuits are coupled to said system bus and said plurality of SIMM modules by leads, leads coupling pin assignments of each type tending to be routed together, thereby reducing the potential for lead crossover.

9. The PC board as claimed in claim 8, wherein said leads coupling pin assignments of a given type being approximately the same length as they are routed together.

10. The PC board as claimed in claim 9, wherein said plurality of different types of pin assignments further comprises:
    a plurality of ground leads;
    a plurality of voltage leads;
    a plurality of data leads;
    a plurality of address leads;
    a plurality of enable leads; and
    a plurality of strobe leads.

11. A method for reducing problems associated with lead routing on a circuit board having a top side and a bottom side, comprising the method steps of:
    fabricating a mirror image integrated circuit having pin assignments positioned as a mirror image of each other along an arbitrary axis drawn through the center of said circuit,
    mounting a first mirror image integrated circuit on the top side,
    mounting a second mirror image integrated circuit on the bottom side, wherein said first and second mirror image integrated circuits are rotated 180 degrees in relationship with each other,
    mounting at least one additional integrated circuit of a different type on the top side of said PC board, said additional integrated circuit having some pin assignments which are identical to those on said first and second mirror image integrated circuit,
    coupling a first set of leads between said first mirror image integrated circuit pin assignments and said pin assignments on said integrated circuit of a different type,
    coupling a second set of leads between said second mirror image integrated circuit pin assignments and said pin assignments on said integrated circuit of a different type, wherein, said first and second set of leads follow the same direction because of said mirror image pin assignment and minimizes the potential for lead crossover.

12. The method reducing problems associated with lead routing on a circuit board as claimed in claim 11, wherein, said mirror image pin assignments are grouped together by type.

13. The method for reducing problems associated with lead routing on a circuit board as claimed in claim 11, wherein, some of said mirror image pin assignments are identical and positioned such that when mounted said mirror image integrated circuits are mounted on the top and bottom side of said circuit board, said identical pin assignments are directly opposite each other and coupled together.

\* \* \* \* \*